US009859092B2

(12) United States Patent
Preikszas (10) Patent No.: US 9,859,092 B2
(45) Date of Patent: Jan. 2, 2018

(54) PARTICLE BEAM MICROSCOPE AND METHOD FOR OPERATING A PARTICLE BEAM MICROSCOPE

(71) Applicant: Carl Zeiss Microscopy GmbH, Jena (DE)

(72) Inventor: Dirk Preikszas, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/010,346

(22) Filed: Jan. 29, 2016

(65) Prior Publication Data

US 2016/0225579 A1 Aug. 4, 2016

(30) Foreign Application Priority Data

Feb. 2, 2015 (DE) .................. 10 2015 001 292

(51) Int. Cl.
*H01J 37/21* (2006.01)
*H01J 37/26* (2006.01)

(52) U.S. Cl.
CPC ............ *H01J 37/21* (2013.01); *H01J 37/263* (2013.01); *H01J 37/265* (2013.01); *H01J 2237/0048* (2013.01); *H01J 2237/0492* (2013.01)

(58) Field of Classification Search
CPC ................................ H01J 37/21; H01J 37/263
See application file for complete search history.

(56) References Cited

U.S. PATENT DOCUMENTS

| 5,264,703 | A | * | 11/1993 | Shibano | ................ | H01J 37/21 250/310 |
| 6,107,637 | A | * | 8/2000 | Watanabe | ............. | B82Y 10/00 250/208.1 |
| 6,521,891 | B1 | | 2/2003 | Dotan et al. | | |
| 6,653,632 | B2 | | 11/2003 | Kazumori | | |
| 6,664,546 | B1 | | 12/2003 | McCord et al. | | |
| 7,161,158 | B2 | | 1/2007 | Shemesh et al. | | |
| 2006/0016990 | A1 | * | 1/2006 | Suzuki | ................... | H01J 37/21 250/310 |

(Continued)

OTHER PUBLICATIONS

Y. Ose et al., "Improved CD-SEM Optics with Retarding and Boosting Electric Fields", Microlithography '99, International Society for Optics and Photonics, 1999, pp. 930-939.

(Continued)

*Primary Examiner* — Wyatt Stoffa
*Assistant Examiner* — Eliza Osenbaugh-Stewar
(74) *Attorney, Agent, or Firm* — Fish & Richardson P.C.

(57) ABSTRACT

A method for operating a particle beam microscope includes: setting a potential of a particle source; setting a potential of an object; directing a particle beam onto the object; focusing the particle beam using a particle-optical lens; providing a dependence between a value of an excitation of the particle-optical lens and a value of the potential of the object; changing a manipulated variable with the aid of an actuating element actuatable by a user; and setting the excitation of the particle-optical lens in a manner dependent on the manipulated variable. In a first mode of operation, the potential of the object is set on the basis of the excitation of the particle-optical lens in accordance with the dependence between the value of the excitation of the particle-optical lens and the value of the potential of the object.

27 Claims, 3 Drawing Sheets

(56) References Cited

U.S. PATENT DOCUMENTS

2008/0093551 A1* 4/2008 Tsuneta .................. G06T 5/006
                                                                                     250/310
2009/0039264 A1* 2/2009 Ikegami .................. H01J 37/21
                                                                                     250/311

OTHER PUBLICATIONS

German Office Action, with translation thereof, for corresponding DE application No. 10 2015 001 292.4 dated Oct. 26, 2015.

* cited by examiner

PARTICLE BEAM MICROSCOPE AND METHOD FOR OPERATING A PARTICLE BEAM MICROSCOPE

CROSS-REFERENCE TO RELATED APPLICATION

The application claims benefit under 35 U.S.C. §119 of German Patent Application Serial No. 10 2015 001 292.4, filed Feb. 2, 2015, the entire contents of which are incorporated by reference herein.

FIELD

The disclosure relates to particle beam microscopes and to methods for operating particle beam microscopes. In particular, the disclosure relates to those particle beam microscopes and methods, in which a particle beam is focused at an object to be examined.

BACKGROUND

An example of a particle beam microscope is a scanning electron microscope, in which a focused electron beam is scanned over an object to be examined and secondary electrons or backscattered electrons, generated by the incident electron beam at the object, are detected in a manner dependent on the deflection of the focused particle beam in order to generate an electron-microscopic image of the object.

The particle beam is generated by a particle source and accelerated, it possibly passes through a condenser lens and it is focused at the object by an objective lens. In order to obtain a high spatial resolution of the particle beam microscope, the particle beam is focused to the best possible extent at the object, i.e. a region illuminated by the focused particle beam at the surface of the object ("beam spot") should be as small as possible. In practice, this is achieved by virtue of a user setting the focusing of the particle beam by hand by actuating an actuating element, such as a focus adjustment wheel, and the controller of the particle beam microscope changing the excitation of the objective lens in a manner dependent on the actuation of the actuating element. During this adjustment process, the particle beam is scanned continuously over the object in order to record images. The user can assess the quality of the current images and, in a manner dependent thereon, actuate the actuating element until he is satisfied with the quality of the images or he can no longer improve the quality thereof. Then, within the meaning of the assessment of the quality of the images carried out by the user, the particle beam is focused to the best possible extent. However, this process is also time-consuming.

The kinetic energy with which the particles are incident on the object is given by the difference between the electric potential of the particle source and the electric potential of the object. Electric fields are present between the objective lens and the object in some particle beam microscopes in order to provide a lens effect for focusing the particle beam and/or in order to reduce the kinetic energy of the particles prior to incidence on the object. In some cases, it is desirable to change the electric potential of the object in order to bring about a modified observation situation, which generates a change in contrast of the image being created. A change in contrast can be brought about by virtue of electric fields at the object being modified by the modified potential of the object, which has an influence on the trajectories of backscattered electrons and, in particular, secondary electrons and on the acceleration thereof toward a detector. As a result of this, it is possible to make certain structures of the object visible in the image, which structures are not visible in a different observation situation. With a change in the electric potential of the object, there is a change in the kinetic energy with which the particles are incident on the object, and there is also a change in the electric fields between object and objective lens. Both have an influence on the focusing of the particle beam at the object, and so the user once again sets the focusing of the beam after a change in the electric potential of the object.

SUMMARY

The disclosure proposes a method for operating a particle beam microscope which makes it easier to focus of a particle beam after changing the electric potential of the object. Furthermore, the disclosure proposes a particle beam microscope which makes this easing possible.

Embodiments of the disclosure provide a method for operating a particle beam microscope, which includes a setting of an electric potential of a particle source, a setting of an electric potential of an object to be examined by the particle beam microscope, a generating of a particle beam of particles emitted by the particle source, a directing of the particle beam onto the object and a focusing of the particle beam with at least one particle-optical lens. In order to focus the particle beam at the object in a suitable manner, the method moreover includes a setting of an excitation of the at least one particle-optical lens and a changing of a manipulated variable with the aid of an actuating element actuatable by a user, wherein the excitation of the at least one particle-optical lens is set in a manner dependent on the manipulated variable. Hence, the user can change the focusing of the beam by actuating the actuating element.

In accordance with exemplary embodiments herein, the method includes a first mode of operation, in which not only the excitation of the at least one particle-optical lens but also the electric potential of the object are changed together in a manner dependent on the manipulated variable. In accordance with exemplary embodiments herein, this can be achieved by virtue of a dependence being provided between the value of the excitation of the at least one particle-optical lens and the value of the electric potential of the object and, in the first mode of operation, the electric potential of the object being set on the basis of the excitation of the at least one particle-optical lens in accordance with the dependence between the value of the excitation of the at least one particle-optical lens and the value of the electric potential of the object. Hence, by actuating the actuating element, the user can simultaneously change the focusing of the particle beam by the at least one particle-optical lens and the electric potential of the object. As a result of this coupling between the change in the electric potential of the object and the change in the excitation of the at least one particle-optical lens in a manner dependent on the change in the manipulated variable by way of the actuation of the actuating element by the user, it is possible to advantageously change settings of the particle beam microscope during the operation.

In accordance with exemplary embodiments, the dependence between the value of the excitation of the at least one particle-optical lens and the value of the electric potential of the object is provided in such a way that the particle beam, for various values of the excitation of the at least one particle-optical lens, is focused to the best possible extent onto the object in each case. Under the assumption that, in a current operating state of the particle beam microscope with a given current excitation of the at least one particle-optical lens and a given current electric potential of the object, the particle beam is focused satisfactorily at the object, a change in the excitation of the at least one particle-optical lens as a result of the actuation of the actuating element by the user while keeping the current setting of the electric potential of the object would lead to defocusing of the particle beam at the object. This would lead to deterioration in the quality of the particle-microscopic image of the object recorded thereupon. However, since the potential of the object is likewise modified in accordance with the dependence between the value of the excitation of the at least one particle-optical lens and the value of the electric potential of the object, the satisfactory focusing of the particle beam at the object is largely maintained, even in the case of the change in the excitation of the at least one particle-optical lens. As a result, the actuation of the actuating element by the user leads to the electric potential of the object being modified substantially, without the focusing of the particle beam at the object being changed substantially. The change in the electric potential of the object in turn leads to various structures of the object being visible in the recorded particle-microscopic image of the object with a changed contrast. As a result, by actuating the actuating element, the user can make certain structures of the object more visible or even make them visible at all.

In accordance with exemplary embodiments, the dependence between the value of the excitation of the at least one particle-optical lens and the value of the electric potential of the object is representable as a function, the function value of which represents the electric potential of the object, and the function having at least one argument, which includes the excitation of the at least one particle-optical lens. The particle beam microscope can include a computing device which is configured to implement this function by virtue of it calculating the value for the potential of the object holder on the basis of a value of the excitation of the at least one particle-optical lens. Furthermore, it is possible that the particle beam microscope includes a memory which, for a multiplicity of values of the excitation of the at least one particle-optical lens, contains assigned values for the potential of the object. In particular, for a multiplicity of combinations of values for the excitation of the at least one particle-optical lens and values for the potential of the particle source, the memory can contain at least one assigned value for the potential of the object in each case. Furthermore, for a multiplicity of combinations of values for the excitation of the at least one particle-optical lens, values for the potential of the particle source and values of a working distance, i.e. values of the distance between an objective lens of the particle beam microscope and the object, the memory can contain at least one assigned value for the potential of the object in each case.

In accordance with further exemplary embodiments, the electric potential of the particle source is set in the first mode of operation in such a way that the difference between the electric potential of the particle source and the electric potential of the object remains constant in the case of changes in the electric potential of the object. What this achieves is that the kinetic energy of the particles of the particle beam when incident on the object remains constant in the case of changes in the electric potential of the object. As a result of this, the electric potential of the particle source is also modified together with the electric potential of the object and the excitation of the at least one particle-optical lens by the actuation of the actuating element by the user.

Changes in the contrast of various structures of the object in recorded particle-microscopic images as a result of the actuation of the actuating element by the user can therefore substantially only be traced back to changes in the electric potential of the object and not, for example, also to changes in the kinetic energy of the particles of the particle beam incident on the object. On the other hand, it is also possible, in the first mode of operation, to keep the electric potential of the particle source constant in the case of changes in the electric potential of the object.

The dependence between the value of the excitation of the at least one particle-optical lens and the value of the electric potential of the object can furthermore be representable as a function, the function value of which represents the electric potential of the object, which function has both the excitation of the at least one particle-optical lens and the electric potential of the particle source as arguments. In order to implement this function, the particle beam microscope can include a computing device which, on the basis of the value of the excitation of the at least one particle-optical lens and the value of the potential of the particle source, calculates the assigned value for the potential of the object. Furthermore, the particle beam microscope can include a memory which, for a multiplicity of combinations of values for the excitation of the at least one particle-optical lens and values for the potential of the particle source, contains at least one value for the potential of the object holder in each case. In particular, for a multiplicity of combinations of values for the excitation of the at least one particle-optical lens and values for the potential of the particle source, the memory can contain at least one assigned value for the potential of the object holder in each case. Furthermore, for a multiplicity of combinations of values for the excitation of the at least one particle-optical lens, values for the potential of the particle source and values of a working distance, the memory can contain at least one assigned value for the potential of the object holder in each case.

In accordance with exemplary embodiments, the method furthermore includes a switching-over from the first mode of operation to a second mode of operation, wherein, in the second mode of operation, the electric potential of the object is kept constant in the case of changes in the excitation of the at least one particle-optical lens. This second mode of operation can be used for setting the focusing of the particle beam at the object. Thus, the user can record particle-microscopic images of the object in an iterative process and actuate the actuating element on the basis of an assessment of the quality of the recorded images in order to change the excitation of the at least one particle-optical lens without changing the electric potential of the object and therefore change the focusing of the particle beam at the object. This procedure can be continued until the focusing of the particle beam at the object is satisfactory. Thereupon, there can once again be a switch into the first mode of operation so as to change the contrasts of various structures of the object in the recorded images without changing the focusing of the particle beam at the object.

In accordance with embodiments of the disclosure, a particle beam microscope is proposed, which includes a particle source for generating a particle beam, an object holder, at least one particle-optical lens, a control element outputting a control signal in a manner dependent on an actuation by a user and a controller, wherein the controller has a first mode of operation, in which it is configured to set a potential of the particle source, set an excitation of the at least one particle-optical lens in a manner dependent on the control signal and set a potential of the object holder in a manner dependent on the excitation of the at least one particle-optical lens and/or in a manner dependent on the control signal.

In accordance with exemplary embodiments, the particle beam microscope includes an input apparatus for entering a value for the potential of the particle source and/or an input apparatus for entering a value for a difference between the potential of the particle source and the potential of the object holder.

In accordance with exemplary embodiments, the controller has a second mode of operation, in which it is configured to keep the potential of the object holder constant in the case of changes in the excitation of the at least one particle-optical lens and/or in the case of changes in the control signal. In accordance with exemplary embodiments herein, the particle beam microscope furthermore includes an input element, the actuation of which brings about a switching-over from the first mode of operation to the second mode of operation and/or a switching-over from the second mode of operation to the first mode of operation.

In accordance with exemplary embodiments, the at least one particle-optical lens includes a condenser lens and/or an objective lens of the particle beam microscope.

In accordance with exemplary embodiments, the particle beam microscope, for the purposes of generating images, includes a detector for detecting particles of the particle beam which have interacted with an object held on the object holder and/or for detecting particles and/or radiation which are/is generated on the object on account of the particle beam incident on the object. For the purposes of generating images, the particle beam microscope can furthermore include a deflection device in order to scan the particle beam over the object. It is possible to generate the image of the object by recording a detection signal from the detector, or a signal derived from the detection signal, in a manner dependent on the position at the object at which the particle beam is incident on the latter during the scanning.

The particles of the particle beam microscope can be charged particles, such as e.g. electrons or ions, such as e.g. helium ions, and so the particle beam microscope can be an electron beam microscope or an ion beam microscope.

BRIEF DESCRIPTION OF THE DRAWINGS

Embodiments of the disclosure are explained in more detail below on the basis of figures, in which.

DETAILED DESCRIPTION

Figure 1:
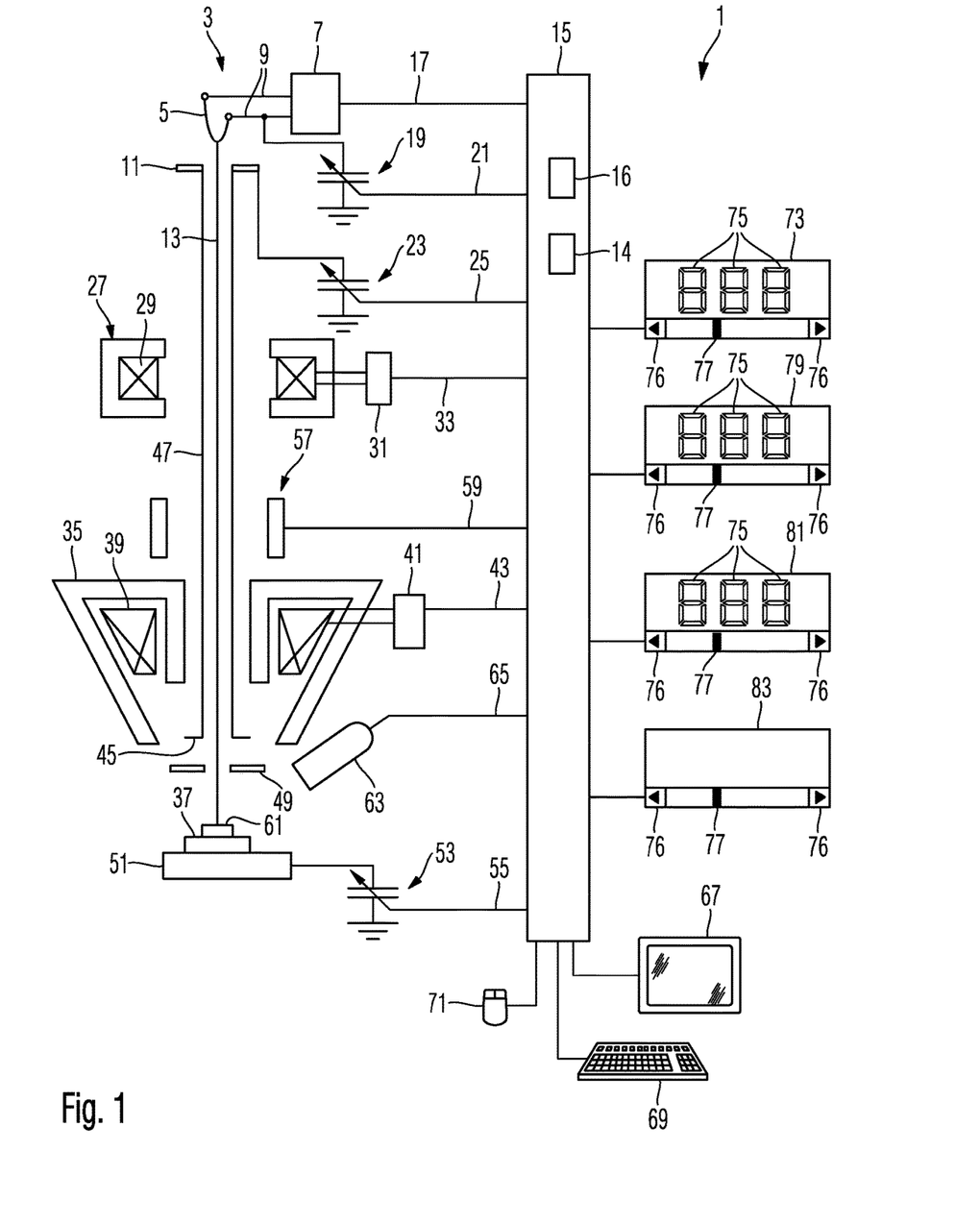
FIG. 1 shows a schematic illustration of a particle beam microscope.

FIG. 1 is a schematic illustration of a particle beam microscope 1. The particle beam microscope 1 includes a particle source 3 including a particle emitter 5 and a driver 7. By way of example, the particle emitter 5 can be a cathode heated by the driver 7 by way of lines 9, which cathode emits electrons which are accelerated away from the emitter 5 by an electrode 11 and which are shaped to form a particle beam 13. To this end, the driver 7 is controlled by a controller 15 of the particle beam microscope 1 by way of a control line 17 and an electric potential of the emitter is set by way of an adjustable voltage source 19, which is controlled by the controller 15 by way of a control line 21. An electric potential of the electrode 11 is set by way of an adjustable voltage source 23, which is likewise controlled by the controller 15 by way of a control line 25. A difference between the electric potential of the emitter 5 and the electric potential of the electrode 11 defines the kinetic energy of the particles of the particle beam 13 after passing through the electrode 11.

The particle beam 13 passes through a condenser lens 27 which collimates the particle beam 13. In the depicted example, the condenser lens 27 is a magnetic lens with a coil 29, which is excited by a current generated by an adjustable current source 31 controlled by the controller 15 by way of a control line 33.

Thereupon, the particle beam 13 passes through an objective lens 35, which focuses the particle beam at a surface of an object 37 to be examined. In the depicted example, the objective lens 35 includes a magnetic lens, the magnetic field of which is generated by a coil 39, which is excited by a current source 41 controlled by the controller 15 by way of a control line 43. The objective lens 35 furthermore includes an electrostatic lens, the electrostatic field of which is generated between one end 45 of a beam tube 47 and an electrode 49. The beam tube 47 is electrically connected to the electrode 11 and the electrode 49 can be electrically connected to the earth potential or be set to a potential different from earth via a further voltage source (not depicted in FIG. 1) controlled by the controller 15.

The object 37 is held on an object holder 51, the electric potential of which is set by way of a voltage source 53 controlled by the controller 15 by way of a control line 55. The object 37 is electrically connected to the object holder 51, and so the object 37 also has the electric potential of the object holder 51. A difference between the electric potential of the particle emitter 5 and the electric potential of the object 37 defines the kinetic energy of the particles of the beam 13 when incident on the object 37. Compared thereto, the particles may have greater kinetic energy within the beam tube 47 and when passing through the condenser lens 27 and the objective lens 35 if they are decelerated by the electrostatic field between the end 45 of the beam tube 47 and the electrode 49 and/or by an electric field between the electrode 49 and the object 37. However, it is also possible to configure the particle beam microscope 1 without beam tube 47 and electrode 49, and so the particles are decelerated or accelerated by an electric field between the electrode 11 and the object 37 prior to being incident on the object 37. Independently of the embodiment of the particle beam microscope 1 with or without beam tube 47 and independently of the embodiment and arrangement of the electrode 49, the kinetic energy of the particles when incident on the object 37 is only dependent on the difference between the potentials of the particle source 3 and of the object 37.

The particle beam microscope 1 furthermore includes a deflection device 57 which is controlled by the controller 15 by way of a control line 59 and which deflects the particle beam 13 such that the particle beam 13 can scan a region 61 on the object 37 under control of the controller 15. The particle beam microscope 1 furthermore includes a detector 63 which is positioned in such a way that particles emanating from the object 37 are incident on the detector 63. In the illustration of FIG. 1, the detector 63 is a detector arranged next to the objective lens 35 and in the vicinity of the object. However, it is also possible for the detector to be arranged in the beam tube 47. Particularly if an electric field at the surface of the object has a decelerating effect on the incident electrons of the particle beam 13, secondary electrons leaving the object at low velocity are accelerated into the beam tube by this electric field and become detectable by the detector in the beam tube 47.

The particles emanating from the object 37 are caused by the particle beam 13 incident on the object 37. In particular, these detected particles can be particles of the particle beam 13 itself, which are scattered at the object 37, such as e.g. backscattered electrons, or they can be particles which are separated from the object 37 by the incident particle beam 13, such as e.g. secondary electrons. However, the detector 63 can also be embodied in such a way that it detects radiation, such as e.g. X-ray radiation, which is generated by the particle beam 13 incident on the object 37. Detection signals from the detector 63 are received by the controller 15 by way of a signal line 65. The controller 15 stores data, derived from the detection signals, in a manner dependent on the current setting of the deflection device 57 during a scanning process, and so these data represent a particle-beam-microscopic image of the region 61 of the object 37. This image can be displayed by a display apparatus 67 connected to the controller 15 and observed by a user of the particle beam microscope 1.

The user can control the various functions of the particle beam microscope 1 by way of input apparatuses, which are connected to the controller 15. A keyboard 69 and a mouse 71 are depicted in an exemplary manner as input apparatuses in FIG. 1. However, further input apparatuses, such as e.g. pushbuttons or rotary knobs, may be provided. The control of some functions of the particle beam microscope 1 by the user is described in an exemplary manner below.

The electric potential of the particle source 3 is adjustable by the user. By way of example, this can be carried out by way of a rotary knob or an operating element 73 of a graphical user interface displayed on the display apparatus 67 by the controller 15. The operating element 73 includes a display of numerals 75, which represent the value of the electric potential of the particle source 3. By way of example, the numerals 75 can be entered by the user by way of the keyboard 69. Furthermore, the user can actuate buttons 76 with the mouse 71 in order to increase or decrease the electric potential of the particle source 3, or he can displace a slider 77 with the mouse in order to change the electric potential of the particle source 3. An operating element 79 corresponding to the operating element 73 is provided for setting the electric potential of the electrode 11. A further corresponding operating element 81 is provided for setting the electric potential of the object holder 51.

By way of the operating elements 73, 79 and 81, the user is able to predetermine the parameters of the particle beam microscope 1, which parameters determine the kinetic energy of the particles of the particle beam 13 when incident on the object 37 and while passing through the particle-optical lenses 27 and 35. Then, the user still sets the focussing of the particle beam 13 at the object 37. The focus of the particle beam 13 at the object 37, i.e. the size of the cross section of the particle beam 13 when incident on the object 37, limits the spatial resolution of the image generable by the particle beam 13. The focusing of the particle beam 13 at the object 37 is determined by the excitation of the particle-optical lenses, i.e. the excitation of the condenser lens 27 and the excitation of the objective lens 35. The excitation of the condenser lens 27 is determined by the strength of the current supplied to the coil 29 by the current source 31 and the excitation of the objective lens 35 is determined by the strength of the current supplied to the coil 39 by the current source 41. Here, the excitation of the condenser lens 27 can be predetermined by the controller 15, for example in a manner dependent on the kinetic energy of the particles of the beam 13, and all that can be changed by the user is the excitation of the objective lens 35 in view of the focusing of the particle beam 13 at the object 37. However, it is also possible that the user can change the excitation of the condenser lens 27 in order to change the focusing of the particle beam 13 at the object 37.

In the illustration of FIG. 1, an operating element 83, corresponding to the operating element 73, of the user interface is provided, by which the user can change the excitation of the objective lens 35. A manipulated variable is set by the user by way of the operating element 83. By way of example, this manipulated variable is given by a position of the slider 77 of the operating element 83 between the buttons 76 of the operating element 83. The controller converts the value of this manipulated variable into values for the excitation of the objective lens 35. The value of the excitation of the objective lens is given by the strength of the current which is generated by the current source 41 and supplied to the coil 39. A change in the manipulated variable by way of the operating element 83 is therefore converted by the controller 15 into a change in the current provided by the current source 41. To this end, there is a dependence between the manipulated variable and the excitation of the objective lens 35 in the controller.

In order to make specific structures of a given object visible in particle-microscopic images of the object, the particle beam microscope is set by the user in such a way that the particle beam is focused as finely as possible at the object. By way of example, this can be brought about by changing the excitation of the objective lens 35 by actuating the actuating element 83. Furthermore, it is desirable to change the contrast between various structures of the object in order to make certain structures of the object more visible in the images or in order to make these visible at all.

Figure 3A:
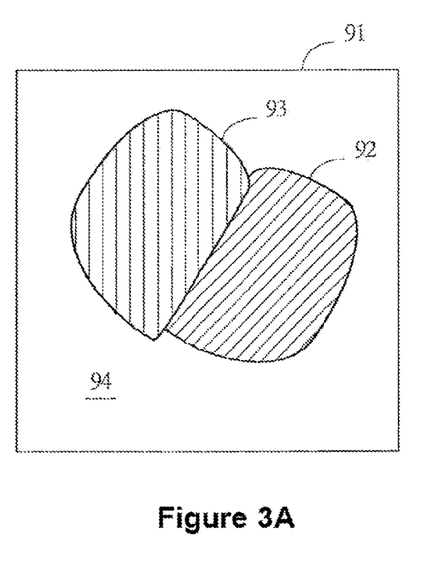
FIG. 3A and FIG. 3B show schematic particle-microscopic images of structures of an object at different settings of the electric potential of the object.
Figure 3B:
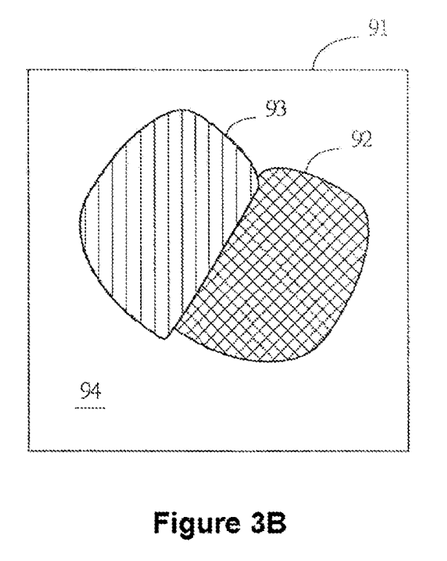

The change in the contrast between various structures of the object by changing the electric potential of the object is now explained on the basis of FIGS. 3A and 3B. FIG. 3A shows a particle-microscopic recording of a region of the object. The object is at a first electric potential during the scanning of the region of the object. Within the image 91, FIG. 3A shows a region 92, within which the surface of the object consists of a first material, and a region 93, within which the object consists of a second material that differs from the first material. The regions 92 and 93 are surrounded by a region 94, in which the surface of the object consists of a further third material that differs from the first and the second material.

In the schematic illustration of FIG. 3A, the brightnesses of the regions 92, 93 and 94, with which these appear in the image 91, are represented by the density of hatchings, wherein the region 94 contains no hatching in order to indicate that this region 94 appears very bright in the image. The region 92 appears very dark and the region 93 appears slightly brighter than the region 92 but substantially darker than the region 94. The difference between the materials in the two regions 92 and 93 is not expressed particularly clearly in the image 91 of FIG. 3A.

FIG. 3B shows a particle-optical image of the same region of the object, which is also imaged in the image 91 of FIG. 3A. However, during the scanning with the particle beam for the purposes of generating the image 91 of FIG. 3B, the object is at an electric potential which differs from the electric potential during the recording of the image in FIG. 3A. As a consequence, the region 93 in the image 91 in FIG. 3B appears much brighter than the region 92, but it nevertheless also appears substantially darker than the region 94.

As a result of this, the three different materials in the three regions 92, 93 and 94 are also better distinguishable from one another in the particle-microscopic image in FIG. 3B.

Therefore, it is possible to change relative contrasts between various structures of the object by changing the electric potential of the object. Apart from the contrast between various structures of the object, which can only be changed by changing the electric potential of the object or by changing the kinetic energy with which the particles of the particle beam are incident on the object, the contrast of a particle-optical image can still be changed by other measures. These measures contain setting a sensitivity of the detector (cf. detector 63 in FIG. 1) and setting the characteristic with which intensity values of the detector are converted into brightness values of the image. By way of example, what can be achieved by these measures is that locations in the image at which the lowest intensities are detected appear black or almost black, locations at which the highest intensities are detected appear white or almost white and no regions of the image are swamped out or underexposed. That is to say the entire dynamic range of detected intensities at a given object is converted into image brightnesses between black and white. Therefore, a contrast-rich representation of the recorded particle-optical image can be obtained using these measures. However, if two materials which are different from one another generate substantially the same detected intensities at a given setting of the electric potential of the object, it is not possible to achieve distinguishability between the two materials in the image using these measures. However, it is possible to obtain such a distinguishability by changing the electric potential of the object since the two materials which are different from one another cause different detected intensities in the case of the modified electric potential of the object.

The change in the contrast between various structures of the object can accordingly be brought about by changing the electric potential of the object 37 by way of actuating the operating element 81. However, only changing the electric potential of the object without changing other settings of the particle beam microscope leads to the particle beam being defocused at the object, and so possible improvements in the contrast between various structures in the recorded particle-microscopic images are not identifiable since the quality of the recorded particle-microscopic images is made worse due to the defocusing of the particle beam. That is why the particle beam microscope 1 has a first mode of operation, referred to as contrast mode below, which enables the change in the contrast of various structures of the object relative to one another without substantial defocusing of the particle beam at the object and a second mode of operation, referred to as focusing mode below, which enables the focusing of the particle beam at the object. The user can switch between the two modes of operation by actuating an actuating element, such as e.g. a key of the keyboard 69 or by way of an operating element provided by the graphical user interface or a separate pushbutton or the like.

Figure 2:
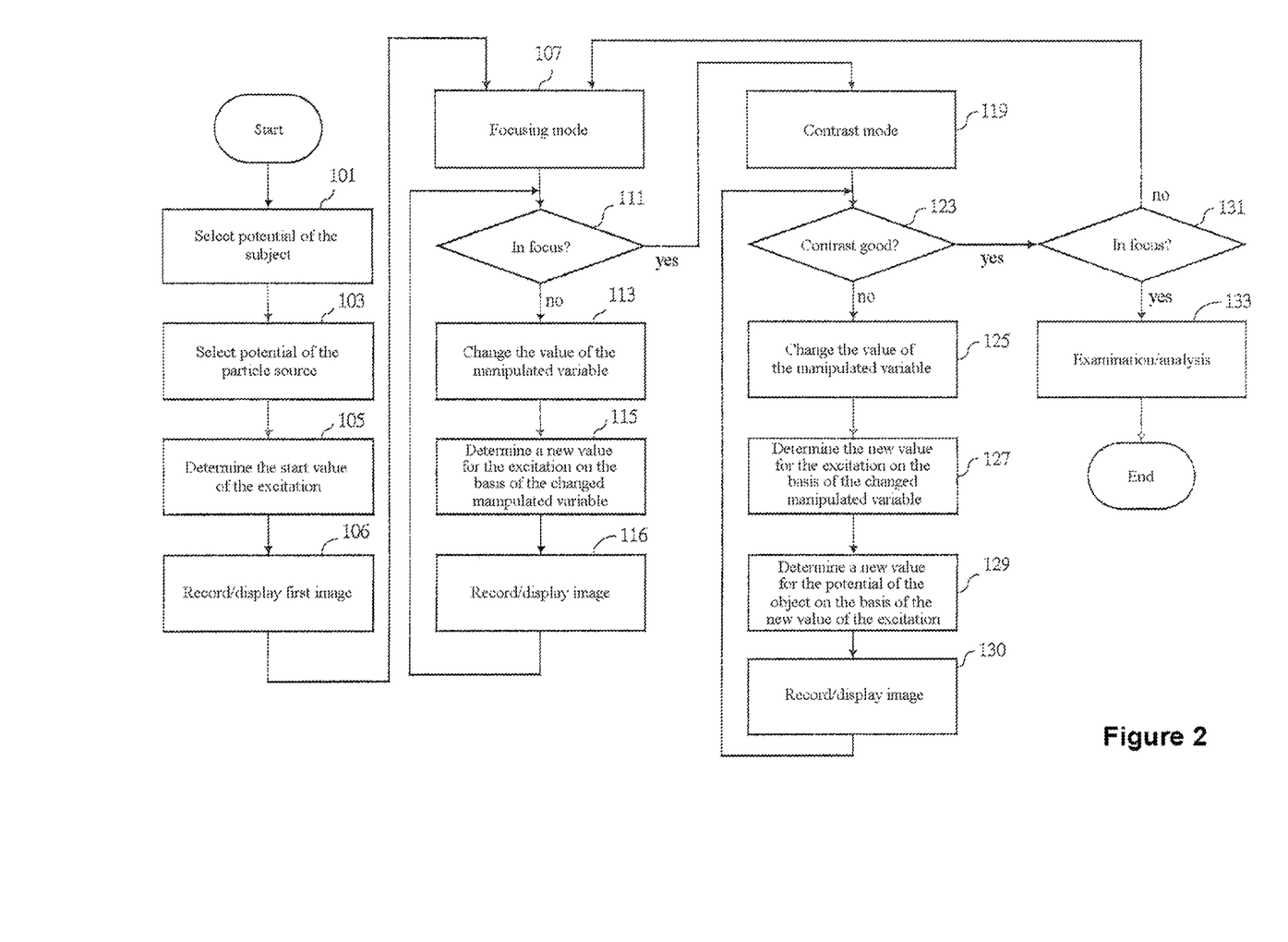
FIG. 2 shows a flowchart for explaining a method for operating the particle beam microscope from FIG. 1.

A particle beam microscope being set in such a way that specific structures of an object are visible with a suitable contrast using images of the object recorded in the particle beam microscope will be explained below on the basis of the flowchart in FIG. 2. The method depicted using the flowchart in FIG. 2 starts with the setting of start values for the potential of the object, the potential of the particle source and the excitation of at least one particle-optical lens of the particle beam microscope, such as e.g. the objective lens, in steps 101, 103 and 105, which can be carried out in any order.

Thereupon, in a step 106, a particle-microscopic image of the object is recorded and displayed by scanning same using the current settings of the potential of the object, the potential of the particle source and the excitation of the at least one particle-optical lens. Thereupon, the particle beam microscope is put into the focusing mode in a step 107. In the focusing mode, a process with steps 111, 113, 115 and 116 is run through repeatedly, until the focusing of the particle beam at the object is satisfactory. A decision is made in step 111 as to whether the last-recorded image is sufficiently in focus. This decision can be made subjectively by the user by observing the image. However, it is also possible to carry out this decision on the basis of objective criteria, which are determined automatically by analysing the particle-beam-microscopic image. Should a determination take place in step 111 that the particle beam is sufficiently focused, the iterative process of the focusing mode is aborted and the particle beam microscope is switched into the contrast mode in a step 119.

If the decision is made in step 111 that a further improvement in the focusing should be possible, the value of the manipulated variable, on which the excitation of the at least one particle-optical lens is dependent, is modified in step 113. In the example of the particle beam microscope 1 shown in FIG. 1, the excitation of the objective lens 35 is modified by actuating the actuating element 83. In step 115, a new value for the excitation of the at least one particle-optical lens is then determined on the basis of the modified manipulated variable. The new value is then used as the current value of the excitation when a particle-microscopic image of the object is recorded and displayed in step 116 using the current settings of the potential of the object, the potential of the particle source and the excitation of the at least one particle-optical lens. Thereupon, the method is continued with step 111, in which a decision can once again be made as to whether or not a sufficiently good setting of the focusing was found.

The electric potential of the object is not modified during the iterative process of the focusing mode with steps 111 to 116. However, the excitation of the at least one particle-optical lens is modified in a manner dependent on the manipulated variable, which in turn is modified by the user by way of actuating the actuating element.

In the contrast mode, an iterative process is once again run through, the iterative process being similar to the iterative process in the focusing mode but differing from the latter in some points. The iterative process in the contrast mode includes steps 123, 125, 127, 129 and 130, which can be run through repeatedly. In step 123, the user can make a decision as to whether specific structures of the object are visible with a desired contrast. Should this be the case, the method is continued with a step 131, in which a decision is once again made as to whether the focusing of the particle beam at the object is satisfactory.

If the decision is made in step 123 that a further improvement in the contrast of the various structures of the object relative to one another should be possible, the value of a manipulated variable, on which the excitation of the at least one particle-optical lens is dependent, is changed in step 125. The user can change the value of the manipulated variable by actuating an actuating element. This can be the same actuating element that is used by the user in step 113 for changing the manipulated variable in order to change the excitation of the at least one particle-optical lens. However, the actuating element used in step 125 for changing the manipulated variable, on which the excitation of the at least one particle-optical lens is dependent, can be a different actuating element to the actuating element used in step 113.

Moreover, the assessment in step 123 in respect of whether the contrast is sufficiently good can be carried out in an automated manner and without the subjective assessment by the user. By way of example, to this end, image processing software can evaluate a distribution of brightnesses in the image on the basis of a histogram of the brightnesses.

In step 127, the new value for the excitation of the at least one particle-optical lens is determined on the basis of the manipulated variable modified in step 125. Furthermore, in a step 129, a new value is determined for the potential of the object on the basis of the new value of the excitation of the at least one particle-optical lens and/or on the basis of the modified manipulated variable.

This can be carried out with the aid of a computing device 14 of the controller 15, which computing device is configured to calculate the value for the potential of the object holder on the basis of a value of the excitation of the at least one particle-optical lens. Furthermore, the controller can include a memory 16 which, for a multiplicity of values of the excitation of the at least one particle-optical lens, contains assigned values for the potential of the object. In particular, for a multiplicity of combinations of values of the excitation of the at least one particle-optical lens and values for the potential of the particle source, the memory can contain at least one assigned value for the potential of the object in each case. Furthermore, for a multiplicity of combinations of values for the excitation of the at least one particle-optical lens, values for the potential of the particle source and values of a working distance, i.e. values of the distance between an objective lens of the particle beam microscope and the object, the memory can contain at least one assigned value for the potential of the object in each case.

The new value for the electric potential of the object and the new value for the excitation of the at least one particle-optical lens, determined in step 127, are then used as the current values for the electric potential of the object and for the excitation of the at least one particle-optical lens, when, in step 130, a particle-microscopic image is recorded and displayed using the current settings of the potential of the object, the potential of the particle source and the excitation of the at least one particle-optical lens. The method is then continued with step 123, in which a decision can once more be made as to whether a sufficiently good contrast is obtained between various structures of the object.

The iterative process in the contrast mode substantially differs from the iterative process in the focusing mode in that, in step 129 of the contrast mode, the value of the electric potential of the object, coupled with the excitation of the at least one particle-optical lens, is determined in a manner dependent on the change in the manipulated variable caused by the user. By contrast, during the iterative process of the focusing mode, the electric potential of the object is kept largely unchanged. The joint change in the electric potential of the object and the excitation of the at least one particle-optical lens in the contrast mode is brought about in such a way that the focusing of the particle beam at the object remains unchanged, i.e. a diameter of the particle beam when incident on the object substantially does not change. As a result of this, a change in the electric potential of the object, and hence a change in the contrast between various structures of the object, is achieved, without reducing the quality of the image as a result of defocusing of the particle beam at the object. The user is therefore able to assess the improvement in a contrast in step 123 without the quality of the image being impaired by a deterioration in the focusing.

The change in the electric potential of the object is brought about in a manner dependent on the value of the excitation of the particle-optical lens. This dependence corresponds to the reality with sufficient accuracy for the purposes of the contrast search and can be determined by physical model calculations or by experiment. However, this dependence cannot exactly predict the reality since changes in the excitation of the at least one particle-optical lens lead to changes in the focusing of the particle beam which, in part, are influenced by non-predictable effects. An example of such a non-predictable effect is the strength of the magnetic field of the particle-optical lens which is generated by the excitation of the particle-optical lens and focusses the particle beam since, for example, a change in the magnetisation of pole pieces and yokes of the particle-optical lens is not created exactly proportional to changes in the excitation due to hysteresis effects. By way of example, these hysteresis effects can be caused by the magnetic reversal of domains in the magnetic material of the pole pieces and yokes. Thus, the change in the electric potential of the object and the change in the excitation of the particle-optical lens in the iterative process within the scope of the contrast mode may lead to the occurrence of a slight deterioration in the focusing of the particle beam at the object. Therefore, the user is provided in step 131 with the possibility of once again checking the focusing of the particle beam in accordance with step 111 within the scope of the focusing mode. If the focusing is also assessed as being satisfactory in step 131, the method for setting the particle beam microscope is completed. Then, a desired examination or analysis can be performed in a step 133 using the particle beam microscope set to this extent. By way of example, this may include the recording of a further particle-microscopic image with, for example, a high pixel resolution or high magnification, the evaluation of the last recorded image in respect of various criteria and the carrying out of an EDX analysis (EDX: "energy-dispersive X-ray spectroscopy"), a WDX analysis (WDX: "wavelength-dispersive X-ray spectroscopy"), an EBSD analysis (EBSD: "electron backscatter diffraction"), an SIMS analysis (SIMS: "secondary ion mass spectrometry"), an Auger analysis, a CL analysis (CL: "cathodoluminescence") and the like.

Should a determination take place in step 131 that an improvement in the focusing should be possible, the method is continued with step 107, in which a switch is carried out into the focusing mode in order to improve the focusing of the particle beam at the object. Thereupon, a switch can be made into the contrast mode and, depending on the result of the decision in step 123, the contrast can be improved further or the method can be completed.

The change in the electric potential of the object described above serves for changing contrasts of various materials in the image. Independently thereof, the contrast of a given image can be improved by virtue of the sensitivity of the detector and the characteristic of the conversion of the detected intensities into brightnesses of the image being changed. This can be carried out automatically in steps 106, 116 and 130 of recording the image by virtue of the control automatically carrying out appropriate measures for increasing the contrast.

The decisions in steps 111, 123 and 131 can be undertaken subjectively by the user by observing the images. As mentioned previously, these decisions can also be carried out on the basis of objective criteria which are automatically determined by an analysis of the particle-beam-microscopic image. In this case, steps 111, 123 and 131 can merely include the recording of the images, while the displaying of the images for the user is not necessary and can be dispensed with.

Above, embodiments of a method for operating a particle beam microscope were described in an exemplary manner on the basis of an electron microscope. However, this method can also be performed using different particle beam microscopes. Examples of this are ion microscopes which use particle beams with ions, for example He ions.

Furthermore, the particle beam microscope can be integrated into a system which contains one or more further particle beam instruments. By way of example, the further particle beam instrument can generate a particle beam which can be directed onto the same region of an object which is also imaged by the particle beam microscope. The particle beam of the further particle beam instrument can be formed by particles of a particle type which differs from the particle type of the particles of the particle beam of the particle beam microscope. By way of example, the particles of the particle beam of the further particle beam instrument can include electrons, Ga ions, Au ions, Si ions, He ions, Ne ions, Ar ions, positrons and the like. The particle beam of the further particle beam instrument can be used to process the object by virtue of material being removed from the object, or material being deposited on the object, there by the effect of the particles on the object. Such processing of the object can be assisted by the supply of a suitable process gas.

What is claimed is:

1. A method, comprising:
   setting an electric potential of a particle source of a particle beam microscope;
   setting an electric potential of an object;
   generating a particle beam of particles emitted by the particle source;
   directing the particle beam onto the object;
   using a particle-optical lens to focus the particle beam;
   providing a dependence between a value of an excitation of the particle-optical lens and a value of the electric potential of the object;
   using an actuating element to change a variable, the actuating element being actuatable by a user; and
   setting the excitation of the particle-optical lens in a manner dependent on the variable,
   wherein, in a first mode of operation, the electric potential of the object is set on the basis of the excitation of the particle-optical lens in accordance with the dependence between the value of the excitation of the particle-optical lens and the value of the electric potential of the object.

2. The method of claim 1, comprising providing the dependence between the value of the excitation of the particle-optical lens and the value of the electric potential of the object so that the particle beam, in each case of various given values of the excitation of the particle-optical lens, is focused to the best possible extent onto the object.

3. The method of claim 1, wherein the dependence between the value of the excitation of the particle-optical lens and the value of the electric potential of the object is representable as a function having a function value representing the electric potential of the object, and the function has at least one argument comprising the excitation of the particle-optical lens.

4. The method of claim 3, wherein the argument of the function further comprise the electric potential of the particle source.

5. The method of claim 1, wherein, in the first mode of operation, the electric potential of the particle source is set so that the difference between the electric potential of the particle source and the electric potential of the object remains constant in the case of changes in the electric potential of the object.

6. The method of claim 1, wherein, in the first mode of operation, the electric potential of the particle source remains constant in the case of changes in the electric potential of the object.

7. The method of claim 1, further comprising switching into a second mode of operation of the particle beam microscope, wherein, in the second mode of operation, the electric potential of the object is kept constant when the excitation of the particle-optical lens is changed.

8. The method of claim 1, further comprising:
   detecting particles of the particle beam which have interacted with the object; and/or
   detecting particles and/or radiation which emanate from the object due to the particle beam being incident on the object.

9. The method of claim 8, further comprising:
   directing the particle beam onto a multiplicity of locations at the object; and
   generating an image of the object from detection signals from a detector used when detecting.

10. The method of claim 8, further comprising changing the variable based on an analysis of detection signals from a detector used when detecting.

11. The method of claim 10, wherein the variable is changed in the first mode of operation until an image generated from the detection signals has a predetermined contrast.

12. The method of claim 11, wherein the variable is changed based an analysis of the image generated from the detection signals.

13. The method of claim 12, wherein analyzing the image comprises using image processing software to automatedly analyze the image.

14. The method of claim 10, wherein the variable is changed in the second mode of operation until an image generated from the detection signals has a predetermined sharpness.

15. A particle beam microscope, comprising:
   a particle source configured to generate a particle beam;
   an object holder;
   a particle-optical lens;
   a control element configured to output a control signal in a manner dependent on an actuation by a user; and
   a controller configured so that, in a first mode of operation, the controller is configured to set:
   a potential of the particle source;
   an excitation of the particle-optical lens in a manner dependent on the control signal; and
   a potential of the object holder in a manner dependent on the excitation of the particle-optical lens.

16. The particle beam microscope of claim 15, wherein, in the first mode of operation, the controller is configured to set the potential of the object holder in a manner dependent on the potential of the particle source.

17. The particle beam microscope of claim 15, wherein the dependence between the excitation of the particle-optical lens and the electric potential of the object holder is configured so that the particle beam, for each case of various given excitations of the particle-optical lens, is focused to the best possible extent on an object when held by the object holder.

18. The particle beam microscope of claim 15, further comprising an input apparatus configured to enter a value for the potential of the particle source.

19. The particle beam microscope of claim 15, wherein the controller comprises a memory which, in each case of a multiplicity of combinations of values for the excitation of the particle-optical lens and values for the potential of the particle source, contains at least one value for the potential of the object holder.

20. The particle beam microscope of claim 15, wherein the controller comprises a device configured to calculate a value for the potential of the object holder on the basis of a value of the excitation of the particle-optical lens and a value of the potential of the particle source.

21. The particle beam microscope of claim 15, wherein the controller has a second mode of operation in which the controller is configured to keep the potential of the object holder constant when the excitation of the particle-optical lens is changed and/or when the control signal is changed.

22. The particle beam microscope of claim 21, further comprising an input element configured so that actuating the input element causes the particle beam microscope to switch: a) from the first mode of operation to the second mode of operation; and/or b) from the second mode of operation to the first mode of operation.

23. The particle beam microscope of claim 15, wherein the particle-optical lens comprises a condenser lens and/or an objective lens.

24. The particle beam microscope of claim 15, further comprising a detector configured to detect: a) particles of the particle beam which have interacted with an object when held by the object holder; and/or b) particles and/or radiation emanating from the object on account of the particle beam incident on the object.

25. The particle beam microscope of claim 15, further comprising a deflection device configured to scan the particle beam over an object when held by the object holder.

26. A method, comprising:
   directing a particle beam generated by a particle source of a particle beam microscope onto an object;
   using a particle-optical lens to focus the particle beam;
   providing a dependence between a value of an excitation of the particle-optical lens and a value of an electric potential of the object;
   using an actuating element to change a variable, the actuating element being actuatable by a user; and
   setting the excitation of the particle-optical lens in a manner dependent on the variable, wherein, in a first mode of operation, the electric potential of the object is set on the basis of the excitation of the particle-optical lens in accordance with the dependence between the value of the excitation of the particle-optical lens and the value of the electric potential of the object.

27. The particle beam microscope of claim 15, wherein the controller is further configured so that the potential of the object holder is set dependent on the excitation of the particle-optical lens in accordance with a dependence between the excitation of the particle-optical lens and an electric potential of the object.

* * * * *